United States Patent
Hsu et al.

(10) Patent No.: US 11,791,819 B2
(45) Date of Patent: Oct. 17, 2023

(54) LOW POWER FLIP-FLOP WITH REDUCED PARASITIC CAPACITANCE

(71) Applicant: Intel Corporation, Santa Clara, CA (US)

(72) Inventors: Steven Hsu, Lake Oswego, OR (US); Amit Agarwal, Hillsboro, OR (US); Simeon Realov, Portland, OR (US); Ram Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 779 days.

(21) Appl. No.: 16/727,742

(22) Filed: Dec. 26, 2019

(65) Prior Publication Data

US 2021/0203323 A1     Jul. 1, 2021

(51) Int. Cl.
| | | |
|---|---|---|
| *H03K 19/00* | (2006.01) | |
| *H03K 3/012* | (2006.01) | |
| *H03K 3/037* | (2006.01) | |
| *H03K 5/135* | (2006.01) | |
| *G11C 7/22* | (2006.01) | |

(52) U.S. Cl.
CPC ......... *H03K 19/0016* (2013.01); *G11C 7/222* (2013.01); *H03K 3/012* (2013.01); *H03K 3/0372* (2013.01); *H03K 5/135* (2013.01); *H03K 19/0013* (2013.01)

(58) Field of Classification Search
None
See application file for complete search history.

(56) References Cited

U.S. PATENT DOCUMENTS

| | | | | |
|---|---|---|---|---|
| 2015/0249442 A1* | 9/2015 | Hsu | ...................... | H03K 3/35625 327/211 |
| 2016/0164503 A1* | 6/2016 | Kim | ...................... | H03K 3/0372 327/203 |
| 2017/0085253 A1 | 3/2017 | Cao et al. | | |
| 2017/0359054 A1* | 12/2017 | Hsu | ...................... | H03K 19/0002 |
| 2019/0089338 A1 | 3/2019 | Kim et al. | | |
| 2019/0198491 A1 | 6/2019 | Do | | |

FOREIGN PATENT DOCUMENTS

| | | |
|---|---|---|
| KR | 20170122039 | 11/2017 |
| WO | 2014209353 | 12/2014 |

OTHER PUBLICATIONS

International Search Report & Written Opinion dated Jan. 6, 2021 for PCT Patent Application No. PCT/US2020/051258.
Examination Report, IN App. No. 202247014981, dated Jan. 19, 2023, 7 pages.

* cited by examiner

*Primary Examiner* — Jany Richardson
(74) *Attorney, Agent, or Firm* — NICHOLSON DE VOS WEBSTER & ELLIOTT LLP

(57) ABSTRACT

A parasitic-aware single-edge triggered flip-flop reduces clock power through layout optimization, enabled through process-circuit co-optimization. The static pass-gate master-slave flip-flop utilizes novel layout optimization enabling significant power reduction. The layout removes the clock poly over notches in the diffusion area. Poly lines implement clock nodes. The poly lines are aligned between n-type and p-type active regions.

20 Claims, 5 Drawing Sheets

LOW POWER FLIP-FLOP WITH REDUCED PARASITIC CAPACITANCE

BACKGROUND

Clocking is one of the most significant power contributors and limiters for power-constrained server and/or mobile microprocessors and SoCs (system-on-chips), discrete and/or integrated graphics, AI (artificial intelligence) and/or special-purpose accelerators. Reducing power in systems with tight budgets improves performance by allowing integrating more cores, memory, or processing elements, and improves battery life for mobile and edge devices. Dynamic clocking power is the largest contributor and consumes up to, for example, 60% of the overall chip power dissipation, where most of the load is in the final flip-flops.

A flip-flop (FF) is a fundamental circuit used in all digital synchronous systems and must be very low power, since it contributes the most to the clocking power. Today's FFs already utilize minimum sized devices, and cannot be further downsized to reduce power. With process technology scaling, circuits are limited by variations to enable low-voltage operation for high energy-efficiency. This limits the smallest allowable device size preventing any further dynamic power savings though transistor sizing. Since performance, power, and area (PPA) benefits are slowing down as process technology scales (e.g., below the 7 nm process technology node), there is a need for new circuit innovations to improve PPA, specifically to reduce clocking power. In addition, with strong demand for higher frequency CPUs (central processing units), graphics, and AI accelerators, deeper pipelines will exacerbate clocking power, increasing clock power further.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
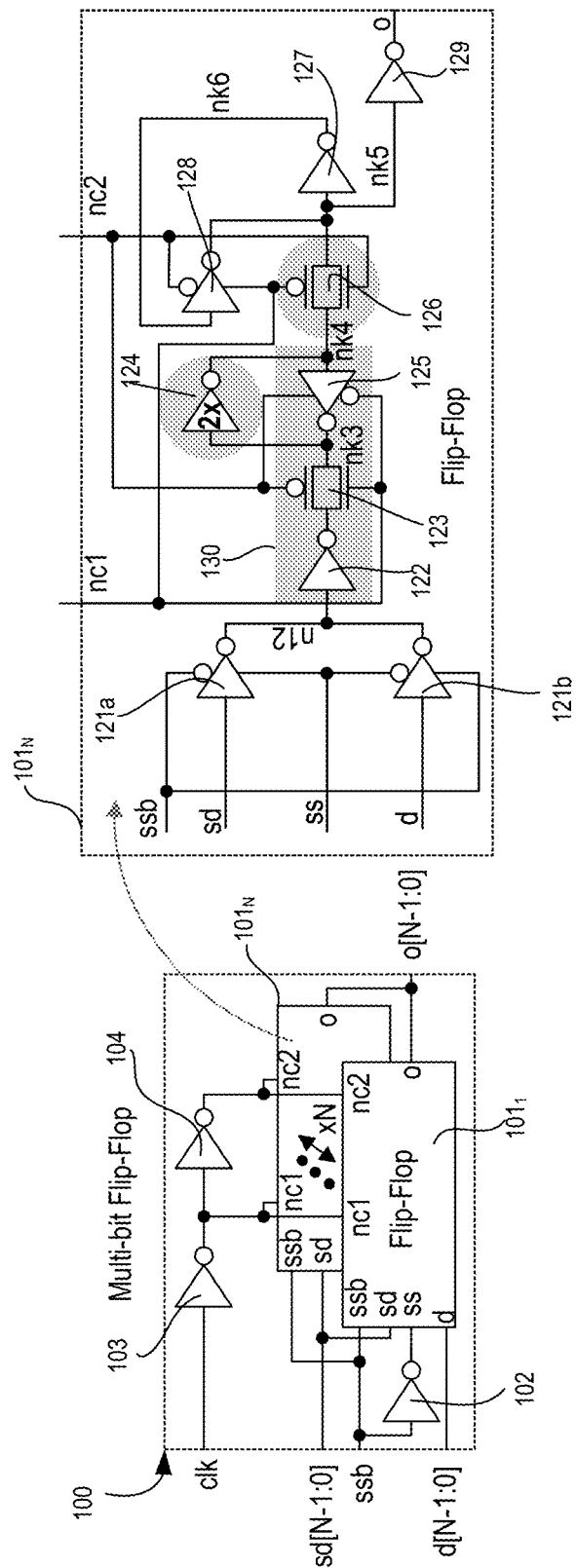
FIG. 1 illustrates a multi-bit transmission-gate flip-flop (FF) with data input multiplexer (Mux-D).

Inside a FF, parasitic capacitance is becoming a large portion of power dissipation. Experimental data shows that clock power is divided evenly between approximately 50% device and approximately 50% interconnect parasitic capacitances. Therefore, careful optimization of parasitic capacitance layout effects is used to achieve low clock power, in accordance with various embodiments. Below 7 nm process technology nodes, scaled FinFET and Gate-all-around (GAA) devices have increasing parasitic capacitances, therefore scaling boosters like contact-over-active gate (COAG) can enable new low power layout optimizations, in accordance with various embodiments.

Some embodiments describe a parasitic-aware single-edge triggered flip-flop that reduces clock power through layout optimization, enabled through process-circuit co-optimization. Some embodiments disclose a static pass-gate master-slave flip-flop that utilizes novel layout optimization enabling significant power reduction. Increasing utilization of minimum device sizes with technology scaling have increased parasitic capacitance contribution to clock power, however, with new scaling boosters like COAG enable new layout structures to minimize these issues.

The flip-flop of various embodiments is a low power FF that uses digital synchronous CPUs, GPUs (graphics processor units), and AI accelerators. The process-circuit co-optimized flip-flop of various embodiments reduces parasitic device and interconnect capacitance to reduce power by eliminating metal routes and diffusion notches. Note, this parasitic capacitance contribution is only worsening as technology scales.

There are many technical effects of various embodiments. For example, the circuit of various embodiments demonstrates ISO-performance/ISO-area with 15% to 25% power savings across mid-height libraries and multi-bit FF configurations, which directly improves chip level power. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

Here, the term "analog signal" is any continuous signal for which the time varying feature (variable) of the signal is a representation of some other time varying quantity, i.e., analogous to another time varying signal.

Here, the term "digital signal" is a physical signal that is a representation of a sequence of discrete values (a quantified discrete-time signal), for example of an arbitrary bit stream, or of a digitized (sampled and analog-to-digital converted) analog signal.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates a multi-bit transmission-gate flip-flop (FF) 100 with data input multiplexer (Mux-D). Multi-bit flip-flops have become the industry standard to reduce flip-flop clocking power and have been integrated into many synthesis and APR tool flows. Multi-bit FF 100 comprises a plurality of FFs $101_{1-N}$, where 'N' is greater than one. Each FF of the plurality receives a scan select signal ssb (and its inverse ss). Inverter 102 generates the inverse of scan select bar, ss. Each FF of the plurality shares clock buffers or inverters 103 and 104 that provide clocks to nodes nc1 and nc2. Here, node names are interchangeably used with signal names. For example, clk may refer to node clk or clock signal depending on the context of the sentence. Each FF receives is scan input and data input. For N number of FF, there are N number of scan input (e.g., sd[N−1:0]) and N number of data inputs (e.g., d[N−1:0]. The output 'o' of each FF can be merged in a N-bit bus (e.g., o[N−1:0]).

One such FF (e.g., $101_N$) is shown in FIG. 1. FF $101_N$ includes a scan input multiplexer to select one of scan input sd or data input d according to scan select signals ss and ssb. The multiplexer comprises two tristate inverters 121a and 121b. Inverter 122 receives output n12 from one of the two tristate inverters 121a and 121b. A master latch receives the output of inverter 122. The master latch comprises transmission pass-gate 123 and a memory element. The memory element comprises cross-coupled inverters—inverter 124 and tristate inverter 125. Clock nodes nc1 and nc2 control transmission gate 123. Clocks on nodes nc1 and nc2 control tristate inverter 125. Here, nodes nk3 and nk4 are state nodes of the master latch. Transmission gate 126 couples the master latch and slave latch. The memory element of the slave latch comprises inverter 127 and tristate inverter 128. The state nodes of the slave latch are nk5 and nk6. The state stored on node nk5 is output via inverter 129 to output node o.

The concept of multi-bit FF involves grouping flip-flops in close physical proximity and combining them into a single standard cell with shared and downsized local clock inverters. This reduces the local clock inverter power contribution and clock pin-cap, however, the internal clock devices per flip-flop remain 8 and all clock nodes nc1 and nc2 must be connected together with metal. Furthermore, to achieve low-voltage operation, the master feed-forward device 124 must be upsized (e.g., 2×) to prevent write-back failure. This sizing constraint increases the clock power due to the diffusion notch and/or may increase layout area.

One disadvantage of the multi-bit flip-flop technique of FIG. 1 is that the parasitic capacitance is a significant portion of the cell power and only results in less power due to the sharing of local clock inverters. Since clock nodes nc1 and nc2 must be connected together with the other flip-flops in the multi-bit structure, this increases the interconnect capacitance contribution. In scaled process technologies, the local interconnect capacitance to finish standard cells is increasing.

FIG. 2A-B illustrate layouts 200 and 220 of portions of the multi-bit transmission-gate FF of FIG. 1, respectively. Layout 200 illustrates p-type devices in well or diffusion 201 and n-type devices below them. Region 202 illustrates the source/drain regions of p-type transistors, while region 203 illustrates the source/drain regions of n-type transistors. The diffusion notch parasitic capacitance increases the clock nc1 or nc2 parasitic capacitances. The nc1 and nc2 polys are broken and unaligned. To align these clock polys in a conventional manner, the clock power saved from metal reduction is offset by the increased diffusion notch capacitance contribution and is un-routable, resulting in very little power savings. The vertical lines are poly lines 204. Layout 200 is of device region 130, which includes inverter 122, pass-gate 123, and tristate inverter 125. FIGS. 2A-B shows nodes, nk3, nk5, n12, nc1, and nc2. Here, the poly lines for clock nodes nc1 and nc2 are broken (e.g., then do not connect with one another at the poly layer) and are connected together with metal wires at a higher metal layer (e.g., metal layer 0 (M0) and metal layer 1 (M1)).

Layout 220 illustrates devices 124 and 126 and their associated nodes nc1, nk4, nk5, power (vcc), and ground (vss). As discussed herein, to achieve low-voltage operation, the master feed-forward device 124 is upsized (e.g., 2×) to prevent write-back failure. This sizing constraint increases the clock power due to the diffusion notch (e.g., 222) and/or may increase layout area. The clock poly lines nc1 and nc2 over respective diffusions 222 and 223 results in more capacitance than a one minimum sized gate capacitance. This extra capacitance results in higher power consumption. One reason for the notch is design rule constraints for the 2× device 124.

Figure 3:
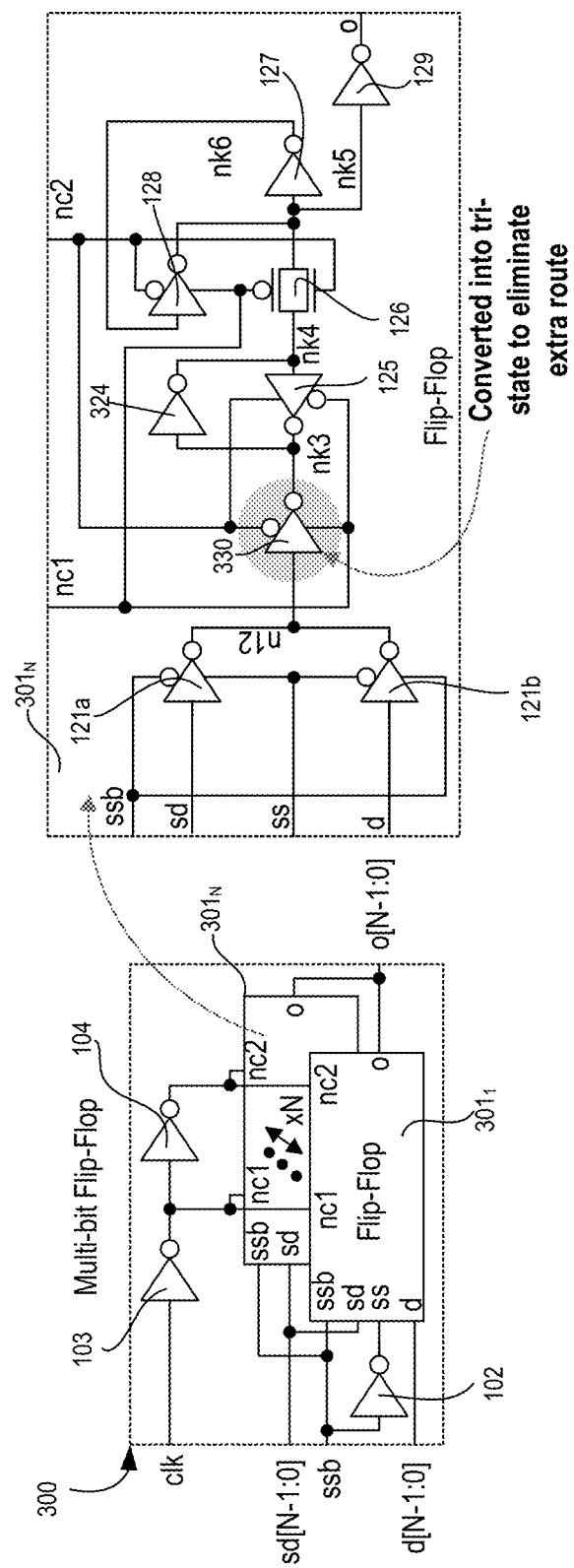
FIG. 3 illustrates a parasitic-aware multi-bit FF with tristate master, in accordance with some embodiments.

FIG. 3 illustrates parasitic-aware multi-bit FF 300 with tristate master, in accordance with some embodiments. Various embodiments lower the clock power of the flip-flop, which is the most dominant portion of the flip-flop power, since data activities have much lower toggle rates.

Multi-bit FF 300 comprises process-circuit co-optimized FFs $301_1$ through $301_N$, where 'N' is a number greater than 1. One such FF $301_N$ is illustrated. FF $301_N$ includes a scan input multiplexer to select one of scan input sd or data input d according to scan select signals ss and ssb. The multiplexer comprises two tristate inverters 121a and 121b. Tristate inverter 330 directly receives output n12 from one tristate inverters 121a/b. Tristate inverter 330 replaces inverter 122 and pass-gate 123 of FF 101. Tristate inverter 330 is part of the master latch, which also includes memory element coupled to the output of tristate inverter 330. The output nk3 of inverter 330 is received a memory element. The memory element comprises cross-coupled inverters—inverter 324 and tristate inverter 125. Clocks nc1 and nc2 control tristate inverter 330 and tristate inverter 125. Here, nodes nk3 and nk4 are state nodes of the master latch. Transmission gate 126 couples the master latch and the slave latch. The memory element of the slave latch comprises inverter 127 and tristate inverter 128. The state nodes of the slave latch are nk5 and nk6. The state stored on node nk5 is output via inverter 129 to output node o.

Figure 4:
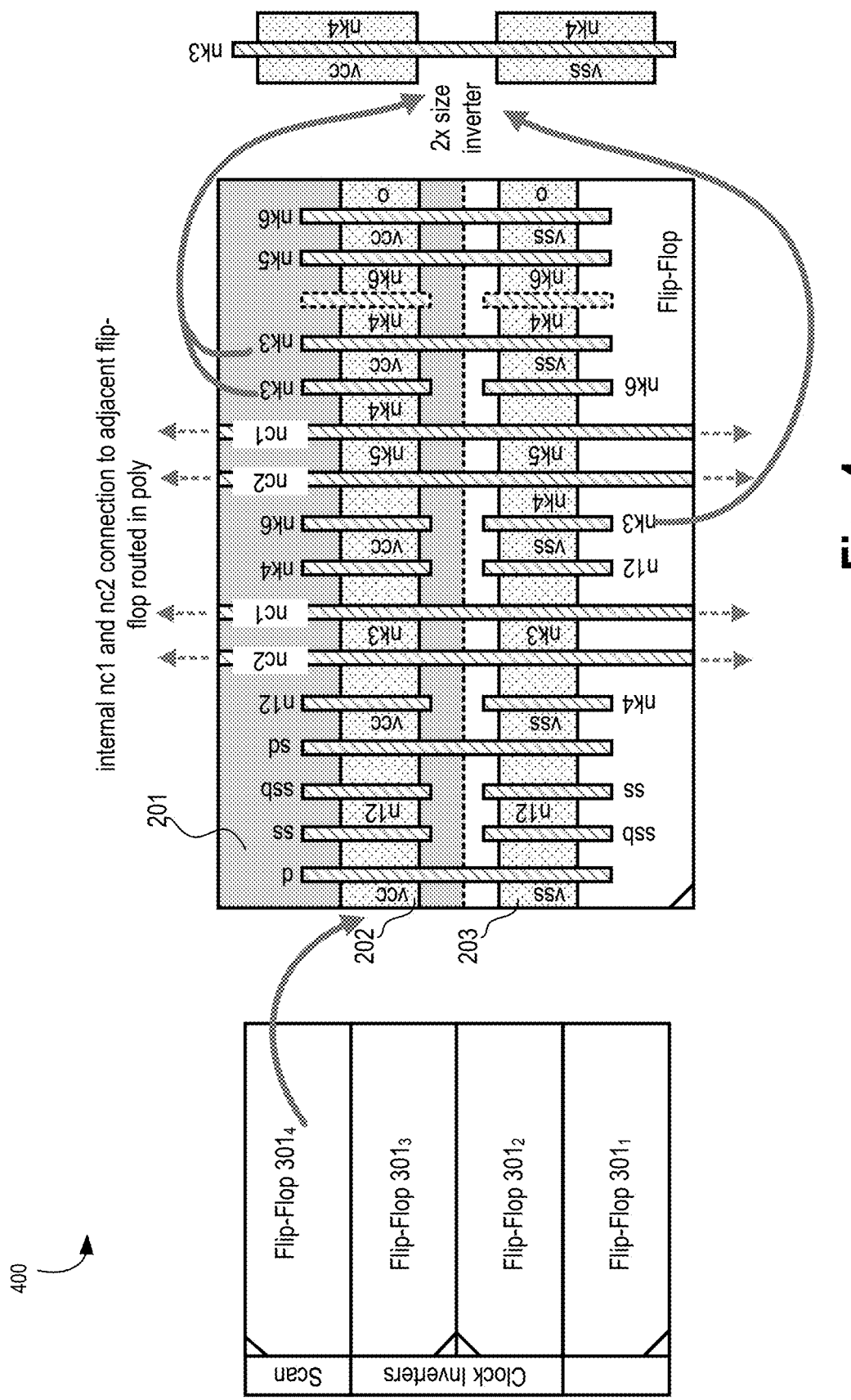
FIG. 4 illustrates layout of parasitic-aware multi-bit FF, in accordance with some embodiments.

FIG. 4 illustrates layout 400 of parasitic-aware multi-bit FF 301, in accordance with some embodiments. Layout 400 removes the diffusion notch found when a 2× master inverter 124, which is interfaced with 1× pass-gate 123. Removing pass-gate 123 and replacing it with tristate inverter 330 results in reduced clock power, especially after aligning clock polys nc1 and nc2. Aligning clock polys nc1 and nc2 results in elimination of many inter-cell routing to finish the cell, reducing the clock power. Since layout 400 uses more horizontal resources (e.g., metal layer 0 (M0)) within the cell layout, in some embodiments circuit modification to FF 100 is made. For example, in some embodiments, tristate inverter 330 replaces the master inv-pass-gate (devices 122 and 123) of FIG. 1. Tristate inverter 330 reduces the need to use metal to route the connection. This modification to the circuit allows for aligned clock polys nc1 and nc2. Layout 400 of the new parasitic-aware multi-bit quad flip-flop 301 with aligned clock polys shows no diffusion notches. The 2× inverter 124 is legged (now device 324) and interleaved with other devices.

In some embodiments, the multi-bit FF (or vectored FF) comprises a pair of inverters (103 and 104) to provide a clock (nc2) and an inverse of a clock (nc1) to a plurality of flip-flops ($301_{1-N}$). The pair of inverters (103 and 104) couples to each FF (e.g., $301_N$). For example, the pair of inverters (103 and 104) are shared by the flip-flops. The FF is circuit and process co-optimized, and comprises a tristate inverter 330 controllable by the clock (nc2) and the inverse of the clock (nc1). In various embodiments, within the layout of the FF, the clock and the inverse of the clock are routed on poly lines that are aligned between p-type active region and n-type active region as shown in FIG. 4. For example, poly routes for nc1 and nc2 have no jogs and extend from region 202 to 203 connecting the gates of n-type and p-type transistors without using higher metal layers (such as metal 0 (M0), metal 1 (M1), and/or their associated vias). As such, capacitance on clock nodes nc1 and nc2 is reduced which directly reduces power consumption of the FF.

The FF further comprises a first memory (e.g., inverter 324 and tristate inverter 125) coupled to output nk3 of tristate inverter 330. This first memory is part of the master latch. By replacing inverter 122 and pass-gate 124 with one tristate inverter 330, the layout of the FF is further simplified. In various embodiments, the layout of inverter 324 uses legged devices. The legged devices that are minimum device-sized, in accordance with various embodiments. For example, inverter 324 is legged into at least two devices such that each leg is a minimum device-sized leg. The notch in the diffusion region of FIG. 2B is mitigated also because all other devices are minimum device-sized. The legging of the layout of inverter 324 aligns the poly lines of clock nodes nc1 and nc2 between diffusion regions. As discussed with reference to FIG. 2B, the diffusion notch increases clock power on clock nodes nc1 and nc2, and further requires higher metal layers to connect the poly lines of nc1 and nc2. Layout 400 eliminates the drawbacks of the diffusion notch.

In various embodiments, the FF comprises a slave latch which includes pass-gate 126 coupled to the first memory. Pass-gate 126 is controllable by the clock and the inverse of the clock. Clock switching capacitance is reduced because the clock nodes nc1 and nc2 are aligned between the p-diffusion and n-diffusion regions. The slave latch further comprises a second memory (e.g., inverter 127 and tristate inverter 128) coupled to pass-gate 126. Output inverter 129 (part of FF) drives the stated on storage node (e.g., nk5) of the slave latch to output o.

Table 1 shows performance, power, and area (PPA) simulation comparisons using 7 nm mid height standard cell libraries.

TABLE 1

Figure 2:
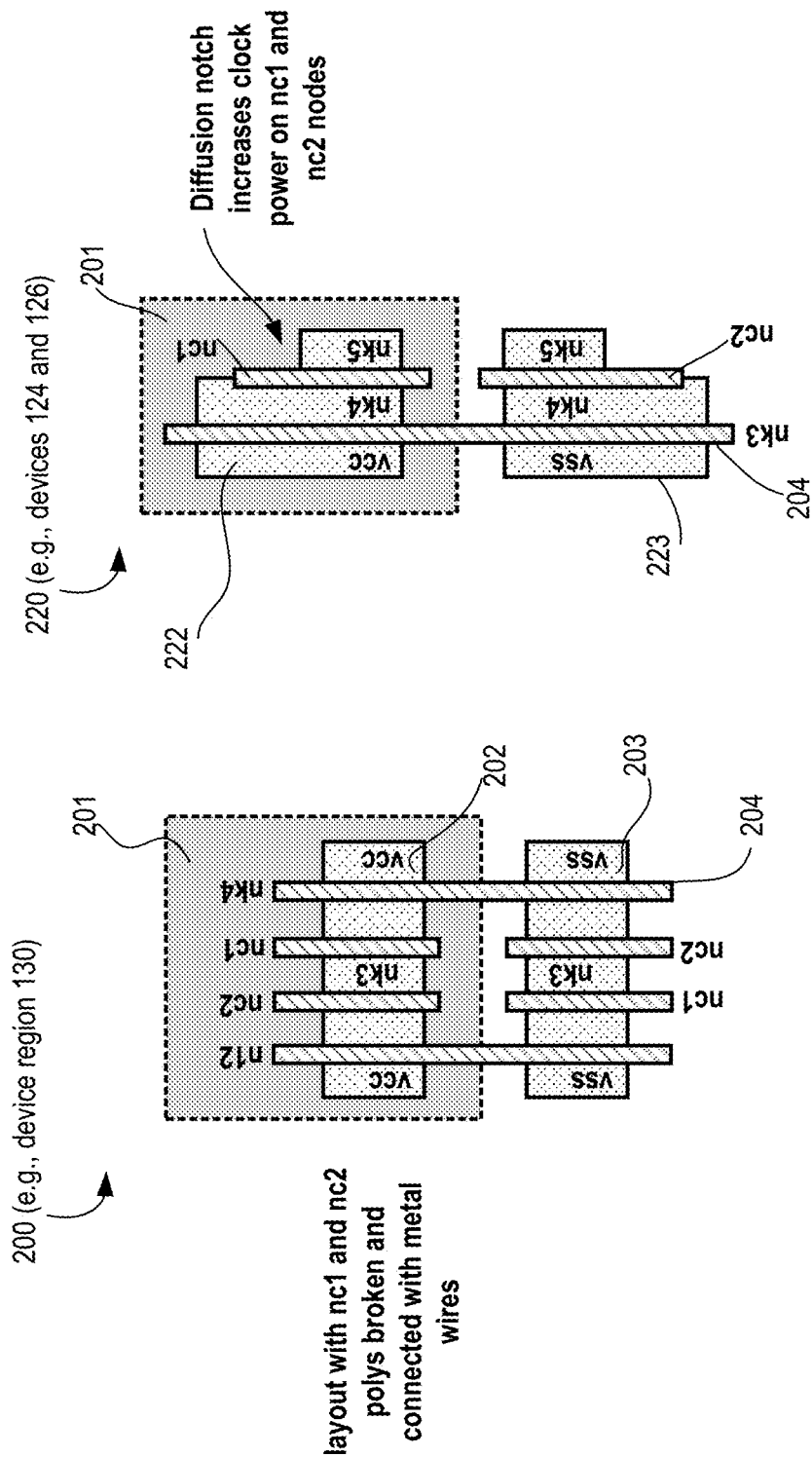
FIG. 2A-B illustrate layouts of portions of the multi-bit transmission-gate FF of FIG. 1, respectively.

| Multi-bit FF Configuration | Standard Cell Height | Delay (Worst-Case Tsetup + TClk2Q) | Power (Activity Factor 10%) | Area |
|---|---|---|---|---|
| FIGS. 1-2 FF | Quad-bit | Mid | 1.0 | 1.0 | 1.0 |
| FIGS. 3-4 FF | Quad-bit | Mid | 1.07 | 0.85 | 1.0 |
| FIGS. 1-2 FF | Octa-bit | Mid | 1.0 | 1.0 | 1.0 |
| FIGS. 3-4 FF | Octa-bit | Mid | 1.0 | 0.81 | 1.0 |

FF circuit 301 demonstrates ISO-performance/ISO-area with 15% to 19% power savings at typical, 0.65V, 100° C. For high-frequency chips with many flip-flops, total chip-level power can be, for example, up to 60%, where 30% is due to the flip-flops. Based on these estimates, FF 300 and its layout 400 can save approximately 1-3% total chip level power, depending on flip-flop usage.

While the embodiments of FIG. 3 and FIG. 4 are illustrated with scan controllable multiplexer, the FF can be implemented without the scan controllable multiplexer. In one such embodiment (not shown), input of tristate inverter 330 directly receives data input 'd'. Other devices of master latch and slave latch remain the same with the same electrical connections and sizes. In this embodiment, the multi-bit FF is similar and smaller than the multi-bit FF of FIG. 3. For example, signal routings for sd[N−1:0], ssb, and inverter 102 are removed. In some embodiments, any one or the inverters (e.g., 102, 103, 104, 324, 127, 129) can be replaced with a NAND or NOR gate to provide additional knob to gate the signal. For example, a control signal to the NAND or NOR gate can enable the NAND or NOR gate to behave as an inverter or output a fixed and deterministic value in response to a logic level of the control signal.

Figure 5:
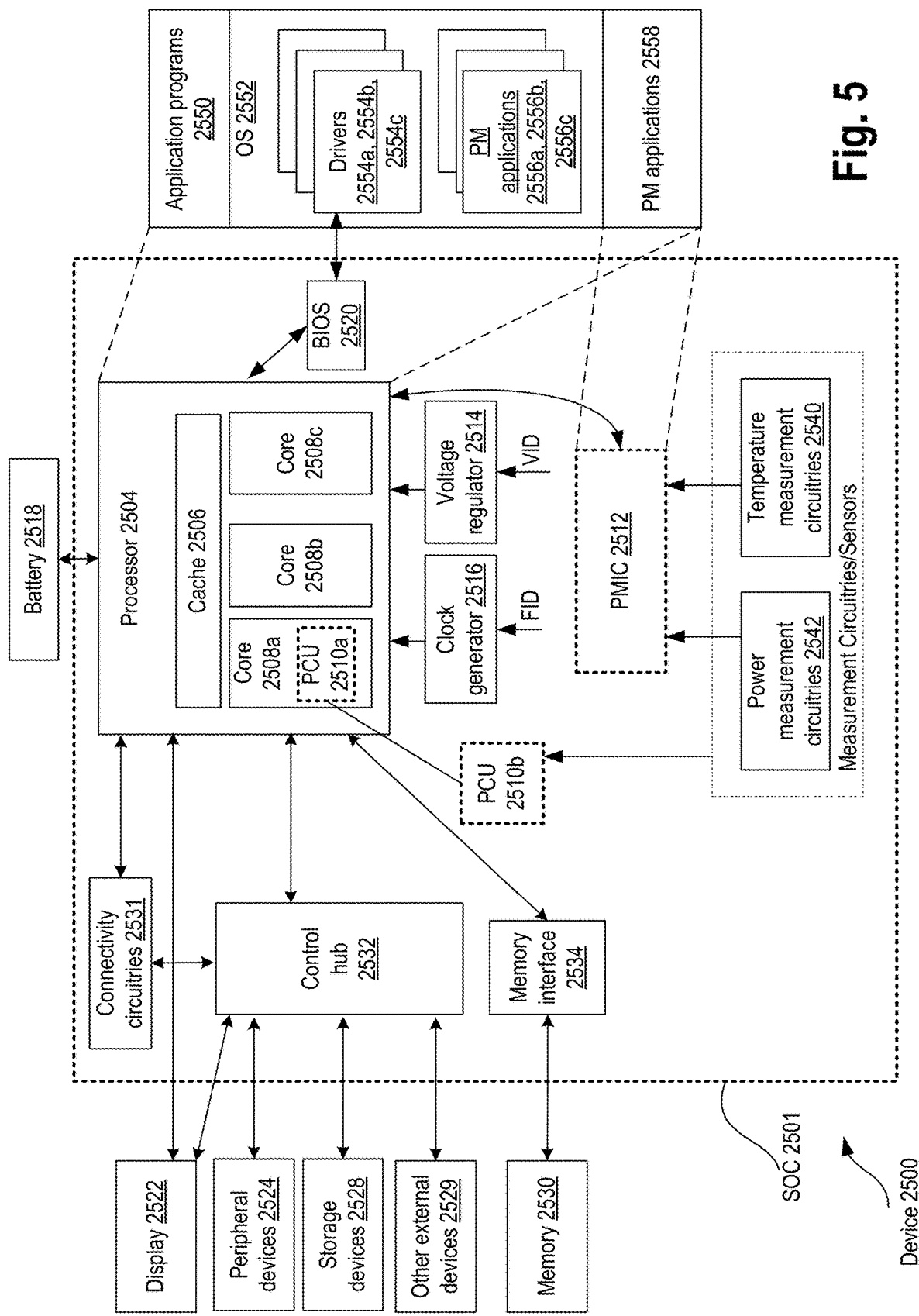
FIG. 5 illustrates a smart device, or a computer system, or an SoC (System-on-Chip) with parasitic-aware multi-bit FF, according to some embodiments of the disclosure.

FIG. 5 illustrates a smart device, or a computer system, or a SoC (System-on-Chip) with parasitic-aware multi-bit FF, according to some embodiments of the disclosure. In some embodiments, device 2500 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2500. Any components here can have the parasitic-aware multi-bit FF. For example, any critical timing path can use the high performance low power parasitic-aware multi-bit FF.

In an example, the device 2500 comprises a SoC (System-on-Chip) 2501. An example boundary of the SOC 2501 is illustrated using dotted lines in FIG. 5, with some example components being illustrated to be included within SOC 2501—however, SOC 2501 may include any appropriate components of device 2500.

In some embodiments, device 2500 includes processor 2504. Processor 2504 can include one or more physical devices, such as microprocessors, application processors, microcontrollers, programmable logic devices, processing cores, or other processing means. The processing operations performed by processor 2504 include the execution of an operating platform or operating system on which applications and/or device functions are executed. The processing operations include operations related to I/O (input/output) with a human user or with other devices, operations related to power management, operations related to connecting computing device 2500 to another device, and/or the like. The processing operations may also include operations related to audio I/O and/or display I/O.

In some embodiments, processor 2504 includes multiple processing cores (also referred to as cores) 2508a, 2508b, 2508c. Although merely three cores 2508a, 2508b, 2508c are illustrated, processor 2504 may include any other appropriate number of processing cores, e.g., tens, or even hundreds of processing cores. Processor cores 2508a, 2508b, 2508c may be implemented on a single integrated circuit (IC) chip. Moreover, the chip may include one or more shared and/or private caches, buses or interconnections, graphics and/or memory controllers, or other components.

In some embodiments, processor 2504 includes cache 2506. In an example, sections of cache 2506 may be dedicated to individual cores 2508 (e.g., a first section of cache 2506 dedicated to core 2508a, a second section of cache 2506 dedicated to core 2508b, and so on). In an example, one or more sections of cache 2506 are shared among two or more of cores 2508. Cache 2506 may be split in different levels, e.g., level 1 (L1) cache, level 2 (L2) cache, level 3 (L3) cache, etc.

In some embodiments, processor core 2504 may include a fetch unit to fetch instructions (including instructions with conditional branches) for execution by the core 2504. The instructions are fetched from any storage devices such as the memory 2530. Processor core 2504 may also include a decode unit to decode the fetched instruction. For example, the decode unit may decode the fetched instruction into a plurality of micro-operations. Processor core 2504 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2504 may be an out-of-order processor core in one embodiment. Processor core 2504 may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 2504 may also include a bus unit to enable communication between components of the processor core 2504 and other components via one or more buses. Processor core 2504 may also include one or more registers to store data accessed by various components of the core 2504 (such as values related to assigned app priorities and/or sub-system states (modes) association.

In some embodiments, device 2500 comprises connectivity circuitries 2531. For example, connectivity circuitries 2531 includes hardware devices (e.g., wireless and/or wired connectors and communication hardware) and/or software components (e.g., drivers, protocol stacks), e.g., to enable device 2500 to communicate with external devices. Device 2500 may be separate from the external devices, such as other computing devices, wireless access points or base stations, etc.

In an example, connectivity circuitries 2531 may include multiple different types of connectivity. To generalize, the connectivity circuitries 2531 may include cellular connectivity circuitries, wireless connectivity circuitries, etc. Cellular connectivity circuitries of connectivity circuitries 2531 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2531 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2531 may include a network interface, such as a wired or wireless interface, e.g., so that a system embodiment may be incorporated into a wireless device, for example, cell phone or personal digital assistant.

In some embodiments, device 2500 comprises control hub 2532, which represents hardware devices and/or software components related to interaction with one or more I/O devices. For example, processor 2504 may communicate with one or more of display 2522, one or more peripheral devices 2524, storage devices 2528, one or more other external devices 2529, etc., via control hub 2532. Control hub 2532 may be a chipset, a Platform Control Hub (PCH), and/or the like.

For example, control hub 2532 illustrates one or more connection points for additional devices that connect to device 2500, e.g., through which a user might interact with the system. For example, devices (e.g., devices 2529) that can be attached to device 2500 include microphone devices, speaker or stereo systems, audio devices, video systems or other display devices, keyboard or keypad devices, or other I/O devices for use with specific applications such as card readers or other devices.

As mentioned above, control hub 2532 can interact with audio devices, display 2522, etc. For example, input through a microphone or other audio device can provide input or commands for one or more applications or functions of device 2500. Additionally, audio output can be provided instead of, or in addition to display output. In another example, if display 2522 includes a touch screen, display 2522 also acts as an input device, which can be at least partially managed by control hub 2532. There can also be additional buttons or switches on computing device 2500 to provide I/O functions managed by control hub 2532. In one embodiment, control hub 2532 manages devices such as accelerometers, cameras, light sensors or other environmental sensors, or other hardware that can be included in device 2500. The input can be part of direct user interaction, as well as providing environmental input to the system to influence its operations (such as filtering for noise, adjusting displays for brightness detection, applying a flash for a camera, or other features).

In some embodiments, control hub 2532 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2522 represents hardware (e.g., display devices) and software (e.g., drivers) components that provide a visual and/or tactile display for a user to interact with device 2500. Display 2522 may include a display interface, a display screen, and/or hardware device used to provide a display to a user. In some embodiments, display 2522 includes a touch screen (or touch pad) device that provides both output and input to a user. In an example, display 2522 may communicate directly with the processor 2504. Display 2522 can be one or more of an internal display device, as in a mobile electronic device or a laptop device or an external display device attached via a display interface (e.g., DisplayPort, etc.). In one embodiment display 2522 can be a head mounted display (HMD) such as a stereoscopic display device for use in virtual reality (VR) applications or augmented reality (AR) applications.

In some embodiments and although not illustrated in the figure, in addition to (or instead of) processor 2504, device 2500 may include Graphics Processing Unit (GPU) comprising one or more graphics processing cores, which may control one or more aspects of displaying contents on display 2522.

Control hub 2532 (or platform controller hub) may include hardware interfaces and connectors, as well as software components (e.g., drivers, protocol stacks) to make peripheral connections, e.g., to peripheral devices 2524.

It will be understood that device 2500 could both be a peripheral device to other computing devices, as well as have peripheral devices connected to it. Device 2500 may have a "docking" connector to connect to other computing devices for purposes such as managing (e.g., downloading and/or uploading, changing, synchronizing) content on device 2500. Additionally, a docking connector can allow device 2500 to connect to certain peripherals that allow computing device 2500 to control content output, for example, to audiovisual or other systems.

In addition to a proprietary docking connector or other proprietary connection hardware, device 2500 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2531 may be coupled to control hub 2532, e.g., in addition to, or instead of, being coupled directly to the processor 2504. In some embodiments, display 2522 may be coupled to control hub 2532, e.g., in addition to, or instead of, being coupled directly to processor 2504.

In some embodiments, device 2500 comprises memory 2530 coupled to processor 2504 via memory interface 2534. Memory 2530 includes memory devices for storing information in device 2500. Memory can include nonvolatile (state does not change if power to the memory device is interrupted) and/or volatile (state is indeterminate if power to the memory device is interrupted) memory devices. Memory device 2530 can be a dynamic random access memory (DRAM) device, a static random access memory (SRAM) device, flash memory device, phase-change memory device, or some other memory device having suitable performance to serve as process memory. In one embodiment, memory 2530 can operate as system memory for device 2500, to store data and instructions for use when the one or more processors 2504 executes an application or process. Memory 2530 can store application data, user data, music, photos, documents, or other data, as well as system data (whether long-term or temporary) related to the execution of the applications and functions of device 2500.

Elements of various embodiments and examples are also provided as a machine-readable medium (e.g., memory 2530) for storing the computer-executable instructions (e.g., instructions to implement any other processes discussed herein). The machine-readable medium (e.g., memory 2530) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS)

which may be transferred from a remote computer (e.g., a server) to a requesting computer (e.g., a client) by way of data signals via a communication link (e.g., a modem or network connection).

In some embodiments, device 2500 comprises temperature measurement circuitries 2540, e.g., for measuring temperature of various components of device 2500. In an example, temperature measurement circuitries 2540 may be embedded, or coupled or attached to various components, whose temperature are to be measured and monitored. For example, temperature measurement circuitries 2540 may measure temperature of (or within) one or more of cores 2508a, 2508b, 2508c, voltage regulator 2514, memory 2530, a mother-board of SOC 2501, and/or any appropriate component of device 2500.

In some embodiments, device 2500 comprises power measurement circuitries 2542, e.g., for measuring power consumed by one or more components of the device 2500. In an example, in addition to, or instead of, measuring power, the power measurement circuitries 2542 may measure voltage and/or current. In an example, the power measurement circuitries 2542 may be embedded, or coupled or attached to various components, whose power, voltage, and/or current consumption are to be measured and monitored. For example, power measurement circuitries 2542 may measure power, current and/or voltage supplied by one or more voltage regulators 2514, power supplied to SOC 2501, power supplied to device 2500, power consumed by processor 2504 (or any other component) of device 2500, etc.

In some embodiments, device 2500 comprises one or more voltage regulator circuitries, generally referred to as voltage regulator (VR) 2514 VR having a high bandwidth and low power differential-to-single-ended type-III compensator. VR 2514 generates signals at appropriate voltage levels, which may be supplied to operate any appropriate components of the device 2500. Merely as an example, VR 2514 is illustrated to be supplying signals to processor 2504 of device 2500. In some embodiments, VR 2514 receives one or more Voltage Identification (VID) signals, and generates the voltage signal at an appropriate level, based on the VID signals. Various type of VRs may be utilized for the VR 2514. For example, VR 2514 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 2510a/b and/or PMIC 2512. In some embodiments, each core has a network of distributed LDOs to provide efficient control for power management. The LDOs can be digital, analog, or a combination of digital or analog LDOs. The VR is an adaptive VR that can provide an adaptive voltage output as discussed with reference to various embodiments.

In some embodiments, device 2500 comprises one or more clock generator circuitries, generally referred to as clock generator 2516. Clock generator 2516 generates clock signals at appropriate frequency levels, which may be supplied to any appropriate components of device 2500. Merely as an example, clock generator 2516 is illustrated to be supplying clock signals to processor 2504 of device 2500. In some embodiments, clock generator 2516 receives one or more Frequency Identification (FID) signals, and generates the clock signals at an appropriate frequency, based on the FID signals. Clock generator 2516 is an adaptive clock source that can provide an adaptive frequency output as discussed with reference to various embodiments.

In some embodiments, device 2500 comprises battery 2518 supplying power to various components of device 2500. Merely as an example, battery 2518 is illustrated to be supplying power to processor 2504. Although not illustrated in the figures, device 2500 may comprise a charging circuitry, e.g., to recharge the battery, based on Alternating Current (AC) power supply received from an AC adapter.

In some embodiments, device 2500 comprises Power Control Unit (PCU) 2510 (also referred to as Power Management Unit (PMU), Power Controller, etc.). In an example, some sections of PCU 2510 may be implemented by one or more processing cores 2508, and these sections of PCU 2510 are symbolically illustrated using a dotted box and labelled PCU 2510a. In an example, some other sections of PCU 2510 may be implemented outside the processing cores 2508, and these sections of PCU 2510 are symbolically illustrated using a dotted box and labelled as PCU 2510b. PCU 2510 may implement various power management operations for device 2500. PCU 2510 may include hardware interfaces, hardware circuitries, connectors, registers, etc., as well as software components (e.g., drivers, protocol stacks), to implement various power management operations for device 2500.

In some embodiments, device 2500 comprises Power Management Integrated Circuit (PMIC) 2512, e.g., to implement various power management operations for device 2500. In some embodiments, PMIC 2512 is a Reconfigurable Power Management ICs (RPMICs) and/or an IMVP (Intel® Mobile Voltage Positioning). In an example, the PMIC is within an IC chip separate from processor 2504. The may implement various power management operations for device 2500. PMIC 2512 may include hardware interfaces, hardware circuitries, connectors, registers, etc., as well as software components (e.g., drivers, protocol stacks), to implement various power management operations for device 2500.

In an example, device 2500 comprises one or both PCU 2510 or PMIC 2512. In an example, any one of PCU 2510 or PMIC 2512 may be absent in device 2500, and hence, these components are illustrated using dotted lines.

Various power management operations of device 2500 may be performed by PCU 2510, by PMIC 2512, or by a combination of PCU 2510 and PMIC 2512. For example, PCU 2510 and/or PMIC 2512 may select a power state (e.g., P-state) for various components of device 2500. For example, PCU 2510 and/or PMIC 2512 may select a power state (e.g., in accordance with the ACPI (Advanced Configuration and Power Interface) specification) for various components of device 2500. Merely as an example, PCU 2510 and/or PMIC 2512 may cause various components of the device 2500 to transition to a sleep state, to an active state, to an appropriate C state (e.g., C0 state, or another appropriate C state, in accordance with the ACPI specification), etc. In an example, PCU 2510 and/or PMIC 2512 may control a voltage output by VR 2514 (e.g., SCVR) and/or a frequency of a clock signal output by the clock generator, e.g., by outputting the VID signal and/or the FID signal, respectively. In an example, PCU 2510 and/or PMIC 2512 may control battery power usage, charging of battery 2518, and features related to power saving operation.

The clock generator 2516 can comprise a phase locked loop (PLL), frequency locked loop (FLL), or any suitable clock source. In some embodiments, each core of processor 2504 has its own clock source. As such, each core can operate at a frequency independent of the frequency of operation of the other core. In some embodiments, PCU 2510 and/or PMIC 2512 performs adaptive or dynamic frequency scaling or adjustment. For example, clock frequency of a processor core can be increased if the core is not operating at its maximum power consumption threshold or limit. In some embodiments, PCU 2510 and/or PMIC 2512 determines the operating condition of each core of a processor, and opportunistically adjusts frequency and/or power supply voltage of that core without the core clocking source (e.g., PLL of that core) losing lock when the PCU 2510 and/or PMIC 2512 determines that the core is operating below a target performance level. For example, if a core is drawing current from a power supply rail less than a total current allocated for that core or processor 2504, then PCU 2510 and/or PMIC 2512 can temporality increase the power draw for that core or processor 2504 (e.g., by increasing clock frequency and/or power supply voltage level) so that the core or processor 2504 can perform at higher performance level. As such, voltage and/or frequency can be increased temporality for processor 2504 without violating product reliability.

In an example, PCU 2510 and/or PMIC 2512 may perform power management operations, e.g., based at least in part on receiving measurements from power measurement circuitries 2542, temperature measurement circuitries 2540, charge level of battery 2518, and/or any other appropriate information that may be used for power management. To that end, PMIC 2512 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2510 and/or PMIC 2512 in at least one embodiment to allow PCU 2510 and/or PMIC 2512 to manage processor core energy at least in part based on value(s) detected by one or more of the sensors.

Also illustrated is an example software stack of device 2500 (although not all elements of the software stack are illustrated). Merely as an example, processors 2504 may execute application programs 2550, Operating System 2552, one or more Power Management (PM) specific application programs (e.g., generically referred to as PM applications 2558), and/or the like. PM applications 2558 may also be executed by the PCU 2510 and/or PMIC 2512. OS 2552 may also include one or more PM applications 2556*a*, 2556*b*, 2556*c*. The OS 2552 may also include various drivers 2554*a*, 2554*b*, 2554*c*, etc., some of which may be specific for power management purposes. In some embodiments, device 2500 may further comprise a Basic Input/Output System (BIOS) 2520. BIOS 2520 may communicate with OS 2552 (e.g., via one or more drivers 2554), communicate with processors 2504, etc.

For example, one or more of PM applications 2558, 2556, drivers 2554, BIOS 2520, etc. may be used to implement power management specific tasks, e.g., to control voltage and/or frequency of various components of device 2500, to control wake-up state, sleep state, and/or any other appropriate power state of various components of device 2500, control battery power usage, charging of the battery 2518, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

Example 1: An apparatus comprising: a multiplexer that is controllable to select one of scan data or data as an output; a tristate inverter coupled to the output of the multiplexer, wherein the tristate inverter is controllable by a clock and an inverse of the clock, wherein the clock and the inverse of the clock are routed on poly lines that are aligned between p-type active region and n-type active region; a first memory coupled to an output of the tristate inverter; a pass-gate coupled to the first memory, wherein the pass-gate is controllable by the clock and the inverse of the clock; a second memory coupled to the pass-gate; and an inverter coupled to an output of the second memory.

Example 2: The apparatus of example 1, wherein the inverter is a first inverter, wherein the first memory comprises a second inverter, which is legged into at least two devices such that each leg is a minimum device-sized leg.

Example 3: The apparatus of example 2, wherein the tristate inverter is a first tristate inverter, wherein the first memory comprises a second tristate inverter coupled to the second inverter and the first tristate inverter, wherein the second tristate inverter is controllable by the clock and the inverse of the clock.

Example 4: The apparatus of example 1, wherein the tristate inverter is directly coupled to the output of the multiplexer.

Example 5: The apparatus of example 1, wherein the multiplexer is controllable by a scan select.

Example 6: The apparatus of example 1, wherein the second memory comprises a third tristate inverter coupled to a third inverter.

Example 7: An apparatus comprising: a pair of inverters to provide a clock and an inverse of a clock; and a plurality of flip-flops, each coupled to the pair of inverters, wherein each of the plurality of flip-flops includes: a tristate inverter controllable by the clock and the inverse of the clock, wherein the clock and the inverse of the clock are routed on poly lines that are aligned between p-type active region and n-type active region; a first memory coupled to an output of the tristate inverter; a pass-gate coupled to the first memory, wherein the pass-gate is controllable by the clock and the inverse of the clock; a second memory coupled to the pass-gate; and an inverter coupled to an output of the second memory.

Example 8: The apparatus of example 7, wherein the inverter is a first inverter, wherein the first memory comprises a second inverter, which is legged into at least two devices such that each leg is a minimum device-sized leg.

Example 9: The apparatus of example 8, wherein the tristate inverter is a first tristate inverter, wherein the first memory comprises a second tristate inverter coupled to the second inverter and the first tristate inverter, wherein the second tristate inverter is controllable by the clock and the inverse of the clock.

Example 10: The apparatus of example 7, wherein the tristate inverter is directly coupled to the output of the multiplexer.

Example 11: The apparatus of example 7, wherein the second memory comprises a third tristate inverter coupled to a third inverter.

Example 12: An apparatus comprising: a tristate inverter controllable by a clock and an inverse of the clock; a first memory coupled to an output of the tristate inverter, wherein a layout of the first memory is uniform and devoid of a notch in a diffusion region associated with the first memory; a pass-gate coupled to the first memory, wherein the pass-gate is controllable by the clock and the inverse of the clock; a second memory coupled to the pass-gate; and an inverter coupled to an output of the second memory.

Example 13: The apparatus of example 12, wherein the clock and the inverse of the clock are routed on poly lines that are aligned between p-type active region and n-type active region.

Example 14: The apparatus of example 12, wherein the inverter is a first inverter, wherein the first memory comprises a second inverter, which is legged into at least two devices such that each leg is a minimum device-sized leg.

Example 15: The apparatus of example 12, wherein the tristate inverter is a first tristate inverter, wherein the first memory comprises a second tristate inverter coupled to the second inverter and the first tristate inverter, wherein the second tristate inverter is controllable by the clock and the inverse of the clock.

Example 16: A system comprising: a memory; a processor coupled to the memory, wherein the processor includes a flip-flop which comprises: a tristate inverter coupled to the output of the multiplexer, wherein the tristate inverter is controllable by a clock and an inverse of the clock; a first memory coupled an output of the tristate inverter, wherein a layout of the first memory is uniform and devoid of a notch in a diffusion region associated with the first memory; a pass-gate coupled to the first memory, wherein the pass-gate is controllable by the clock and the inverse of the clock; a second memory coupled to the pass-gate; and an inverter coupled to an output of the second memory; and a wireless interface to allow the processor to communicate with another device.

Example 17: The system of example 16, wherein the clock and the inverse of the clock are routed on poly lines that are aligned between p-type active region and n-type active region.

Example 18: The system of example 16, wherein the inverter is a first inverter, wherein the first memory comprises a second inverter, which is legged into at least two devices such that each leg is a minimum device-sized leg.

Example 19: The system of example 16, wherein the tristate inverter is a first tristate inverter, wherein the first memory comprises a second tristate inverter coupled to the second inverter and the first tristate inverter, wherein the second tristate inverter is controllable by the clock and the inverse of the clock.

Example 20: The system of example 16, wherein the FF comprises a multiplexer that is controllable to select one of scan data or data as an output.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:
1. An apparatus comprising:
   a multiplexer that is controllable to select one of scan data or data as an output;
   a tristate inverter coupled to the output of the multiplexer, wherein the tristate inverter is controllable by a clock and an inverse of the clock, wherein the clock and the inverse of the clock are routed on poly lines that are aligned between p-type active region and n-type active region;
   a first memory coupled to an output of the tristate inverter;
   a pass-gate coupled to the first memory, wherein the pass-gate is controllable by the clock and the inverse of the clock;
   a second memory coupled to the pass-gate; and
   an inverter coupled to an output of the second memory.
2. The apparatus of claim 1, wherein the inverter is a first inverter, wherein the first memory comprises a second inverter, which is legged into at least two devices such that each leg is a minimum device-sized leg.
3. The apparatus of claim 2, wherein the tristate inverter is a first tristate inverter, wherein the first memory comprises a second tristate inverter coupled to the second inverter and the first tristate inverter, wherein the second tristate inverter is controllable by the clock and the inverse of the clock.

4. The apparatus of claim 1, wherein the tristate inverter is directly coupled to the output of the multiplexer.

5. The apparatus of claim 1, wherein the multiplexer is controllable by a scan select.

6. The apparatus of claim 1, wherein the second memory comprises a third tristate inverter coupled to a third inverter.

7. An apparatus comprising:
- a pair of inverters to provide a clock and an inverse of a clock; and
- a plurality of flip-flops, each coupled to the pair of inverters, wherein each of the plurality of flip-flops includes:
  - a tristate inverter controllable by the clock and the inverse of the clock, wherein the clock and the inverse of the clock are routed on poly lines that are aligned between p-type active region and n-type active region;
  - a first memory coupled to an output of the tristate inverter;
  - a pass-gate coupled to the first memory, wherein the pass-gate is controllable by the clock and the inverse of the clock;
  - a second memory coupled to the pass-gate; and
  - an inverter coupled to an output of the second memory.

8. The apparatus of claim 7, wherein the inverter is a first inverter, wherein the first memory comprises a second inverter, which is legged into at least two devices such that each leg is a minimum device-sized leg.

9. The apparatus of claim 8, wherein the tristate inverter is a first tristate inverter, wherein the first memory comprises a second tristate inverter coupled to the second inverter and the first tristate inverter, wherein the second tristate inverter is controllable by the clock and the inverse of the clock.

10. The apparatus of claim 7, wherein the tristate inverter is directly coupled to an output of a multiplexer.

11. The apparatus of claim 7, wherein the second memory comprises a third tristate inverter coupled to a third inverter.

12. An apparatus comprising:
- a tristate inverter controllable by a clock and an inverse of the clock;
- a first memory coupled to an output of the tristate inverter, the first memory including a feed-forward inverter, wherein a layout of the feed-forward inverter is legged and, wherein a layout of the first memory is uniform and devoid of a notch in a diffusion region associated with the first memory;
- a pass-gate coupled to the first memory, wherein the pass-gate is controllable by the clock and the inverse of the clock;
- a second memory coupled to the pass-gate; and
- an inverter coupled to an output of the second memory.

13. The apparatus of claim 12, wherein the clock and the inverse of the clock are routed on poly lines that are aligned between p-type active region and n-type active region.

14. The apparatus of claim 12, wherein the inverter is a first inverter, wherein the first memory comprises a second inverter, which is legged into at least two devices such that each leg is a minimum device-sized leg.

15. The apparatus of claim 12, wherein the tristate inverter is a first tristate inverter, wherein the first memory comprises a second tristate inverter coupled to the second inverter and the first tristate inverter, wherein the second tristate inverter is controllable by the clock and the inverse of the clock.

16. A system comprising:
- a memory;
- a processor coupled to the memory, wherein the processor includes a flip-flop which comprises:
  - a tristate inverter coupled to the output of the multiplexer, wherein the tristate inverter is controllable by a clock and an inverse of the clock;
  - a first memory coupled to an output of the tristate inverter, the first memory including a feed-forward inverter, wherein a layout of the feed-forward inverter is legged and, wherein a layout of the first memory is uniform and devoid of a notch in a diffusion region associated with the first memory;
  - a pass-gate coupled to the first memory, wherein the pass-gate is controllable by the clock and the inverse of the clock;
  - a second memory coupled to the pass-gate; and
  - an inverter coupled to an output of the second memory; and
- a wireless interface to allow the processor to communicate with another device.

17. The system of claim 16, wherein the clock and the inverse of the clock are routed on poly lines that are aligned between p-type active region and n-type active region.

18. The system of claim 16, wherein the inverter is a first inverter, wherein the first memory comprises a second inverter, which is legged into at least two devices such that each leg is a minimum device-sized leg.

19. The system of claim 16, wherein the tristate inverter is a first tristate inverter, wherein the first memory comprises a second tristate inverter coupled to the second inverter and the first tristate inverter, wherein the second tristate inverter is controllable by the clock and the inverse of the clock.

20. The system of claim 16, wherein the FF comprises a multiplexer that is controllable to select one of scan data or data as an output.

* * * * *